(12) United States Patent
Zitlaw et al.

(10) Patent No.: US 6,549,468 B2
(45) Date of Patent: Apr. 15, 2003

(54) NON-VOLATILE MEMORY WITH ADDRESS DESCRAMBLING

(75) Inventors: Cliff Zitlaw, San Jose, CA (US); Kevin C. Widmer, San Carlos, CA (US); Frankie Fariborz Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/943,474

(22) Filed: Aug. 30, 2001

(65) Prior Publication Data

US 2003/0043636 A1 Mar. 6, 2003

(51) Int. Cl.[7] .............................................. G11C 16/04
(52) U.S. Cl. ......................... 365/185.33; 365/185.01; 365/230.01
(58) Field of Search ................. 365/185.09, 230.01, 365/195, 185.33, 185.22, 185.01; 370/536, 542

(56) References Cited

U.S. PATENT DOCUMENTS

| | | | |
|---|---|---|---|
| 5,638,316 A | * 6/1997 | Hosokawa et al. | .... 365/189.09 |
| 5,646,948 A | * 7/1997 | Kobayashi et al. | ......... 365/195 |
| 5,838,613 A | 11/1998 | Takizawa | |
| 5,844,914 A | 12/1998 | Kim et al. | |
| 5,909,395 A | 6/1999 | Nobukata | |
| 5,943,283 A | 8/1999 | Wong et al. | |
| 5,991,195 A | 11/1999 | Nobukata | |
| 6,359,911 B1 | * 3/2002 | Movshovich et al. | ....... 370/536 |

* cited by examiner

*Primary Examiner*—David Lam
(74) *Attorney, Agent, or Firm*—Leffert Jay & Polglaze P.A.

(57) ABSTRACT

A flash memory has been described that can be coupled to an SDRAM controller that performs address scrambling. The flash memory includes a programmable address de-scrambler. The de-scrambler can be programmed to de-scramble primarily row addresses, including bank addresses, to maintain a common erase block location for sequential data. The present invention reduces the possibility of writing contiguous data to multiple erase blocks. The de-scrambler can be implemented as a programmable switch. The switch includes a routing circuit that can be programmed in a non-volatile manner.

24 Claims, 3 Drawing Sheets

NON-VOLATILE MEMORY WITH ADDRESS DESCRAMBLING

FIELD OF THE INVENTION

The present invention relates generally to memory devices and in particular the present invention relates to non-volatile memory addressing.

BACKGROUND OF THE INVENTION

Memory devices are typically provided as internal storage areas in the computer. The term memory identifies data storage that comes in the form of integrated circuit chips. There are several different types of memory, such as DRAM (dynamic random-access memory), ROM (read-only memory) and EEPROM (electrically erasable programmable read-only memory). EEPROM comprise a large number of memory cells having electrically isolated gates (floating gates). Data is stored in the memory cells in the form of charge on the floating gates. Charge is transported to or removed from the floating gates by programming and erase operations, respectively.

Another type of non-volatile memory is a Flash memory. A Flash memory is a type of EEPROM that can be erased in blocks instead of one address at a time. Programming can occur on an address-by-address basis. A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at high speeds. Many computer systems are designed to operate using SDRAM, but would benefit from non-volatile memory. SDRAM controllers often scramble the addresses provided to the memory. In a volatile memory, address scrambling does not create a problem. In a non-volatile memory, however, scrambled addresses can result in erroneous operation.

For the reasons stated above, and for other reasons stated below which will become apparent to those skilled in the art upon reading and understanding the present specification, there is a need in the art for a non-volatile memory which can operate in a system having address scrambling.

SUMMARY OF THE INVENTION

The above-mentioned problems with non-volatile memory and other problems are addressed by the present invention and will be understood by reading and studying the following specification.

In one embodiment, a non-volatile memory comprises a plurality of address input connections, and an address de-scrambler circuit coupled to the plurality of address connections. The address de-scrambler circuit re-routes signals received on the plurality of address input connections to internal address circuitry.

In another embodiment, a flash memory comprises an array of non-volatile memory cells arranged in erasable blocks, address circuitry to access the array, a plurality of external address connections, and an address de-scrambler circuit coupled to the plurality of address input connections. The address de-scrambler circuit re-routes signals received on the plurality of external address connections to the address circuitry.

A method of accessing a flash memory comprises receiving scrambled address signals, de-scrambling the address signals, and accessing the memory using the de-scrambled addresses.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
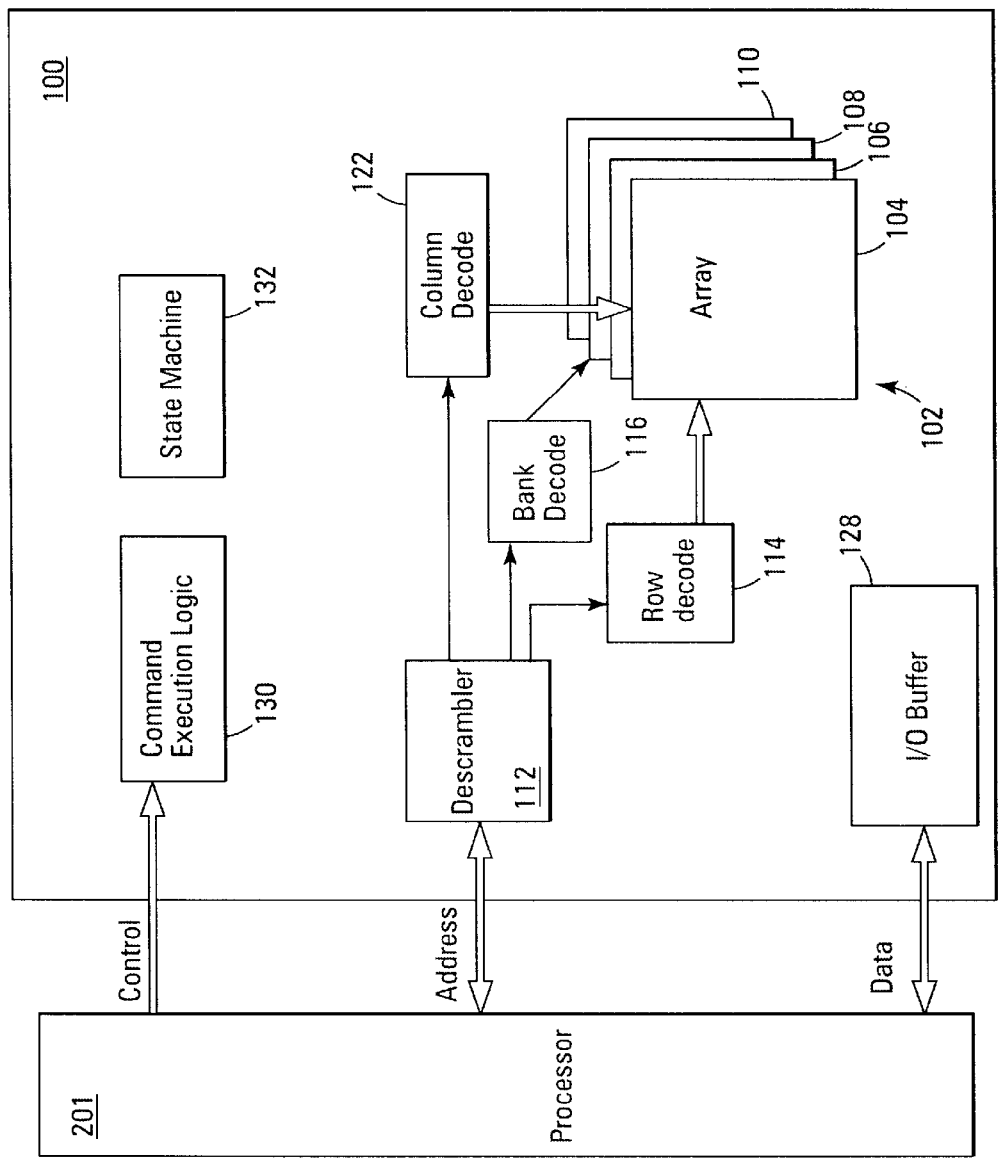
FIG. 1 is a block diagram of a memory according to one embodiment of the present invention.

FIG. 1 illustrates a block diagram of a flash memory device of an embodiment of the present invention. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address decoder circuitry 114. The addresses are also decoded using bank control logic 116. To access an appropriate column of the memory, the received addresses are coupled to column decode circuitry 122. Data is input and output I/O buffer 128. Command execution logic 130 is provided to control the basic operations of the memory device. A state machine 132 is also provided to control specific operations performed on the memory arrays and cells. The command circuit 130 and/or state machine 132 can be generally referred to as control circuitry to control read, write, erase and other memory operations.

Figure 2:
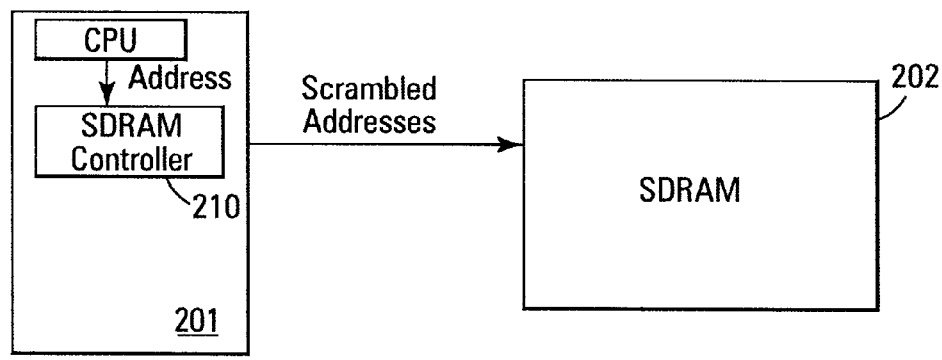
FIG. 2 is a prior art processing system.

Referring to FIG. 2, a prior art SDRAM processing system is described. The system includes a processor 201 coupled to communicate with at least one SDRAM 202. The processor includes an on-chip SDRAM controller 210 to provide interface between the processor and the memory. The DRAM controller scrambles the processor addresses to ease circuit design and allow for the use of many different memory configurations. The processor's A20 address, for example, may drive the SDRAM A9 address pin. Because the SDRAM is volatile, scrambling the addresses does not create a problem in reading or writing.

A problem is encountered when the SDRAM is replaced with a synchronous non-volatile flash memory device. Data stored in the non-volatile memory is often pre-loaded. As such, a scrambled address from the processor to the synchronous non-volatile memory will result in erroneous data output. Further, flash memory is generally arranged in erase blocks. The most significant row address inputs (and bank addresses) are used to identify the erase block. It is desired, therefore, to have contiguous data stored in a common erase block. Scrambling row addresses can result in contiguous data being stored in different blocks.

Figure 3:
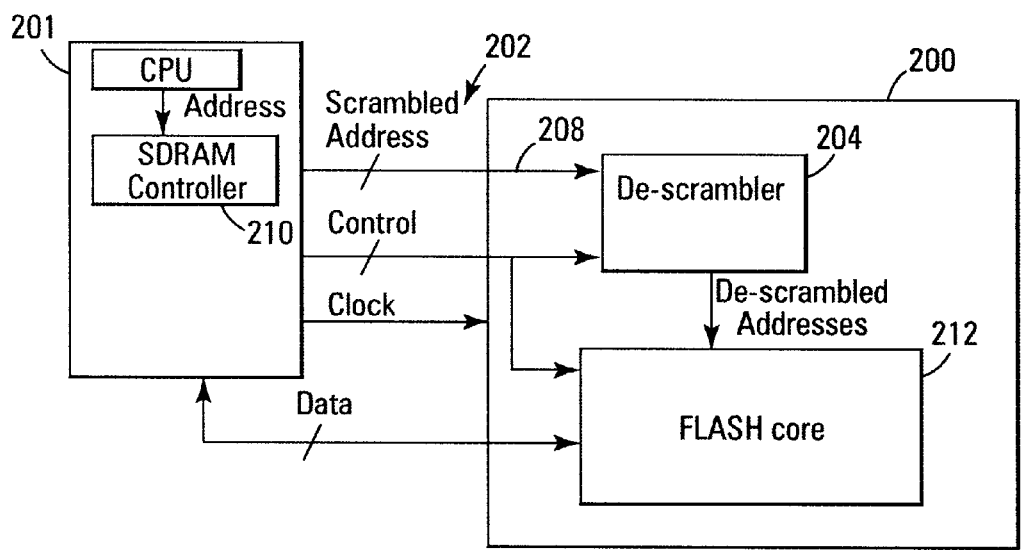
FIG. 3 illustrates a processing system according to one embodiment of the present invention.

An embodiment of the present invention is illustrated in FIG. 3. The system includes a non-volatile memory 200 that can be coupled to a synchronous memory bus 202. The memory includes an address de-scrambler circuit 204. The de-scrambler circuit is programmable to allow for matching to different SDRAM controller configurations. In operation, the de-scrambler circuit receives scrambled addresses from the controller 210 and re-maps the addresses to maintain an ordered row/block location in flash core 212. Flash core 212 is simplified for purposes of focusing on the features of the present invention, and include basic flash circuitry including address circuitry.

Figure 4:
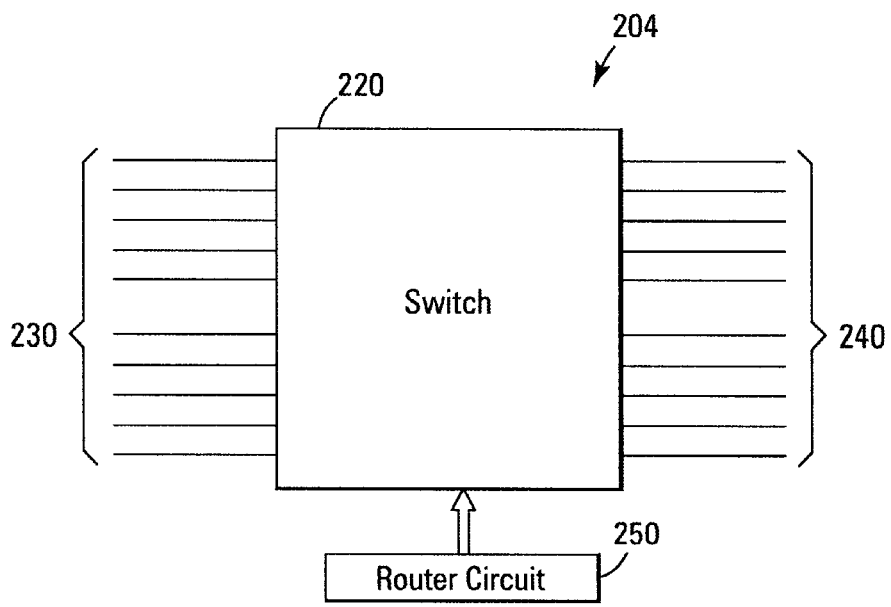
FIG. 4 illustrates a de-scrambler according to one embodiment of the present invention.

One embodiment of the de-scrambler is implemented as a cross-point switch 220, as illustrated in FIG. 4. The switch includes input connections 230 coupled to the address inputs 208. The switch is programmable to selectively couple the input connections to output connections 240. It will be appreciated by those skilled in the art with the benefit of the present description that only scrambled addresses need to be re-routed through the switch. Further, only addresses that are used to define erasable blocks may need to be de-scrambled. The programmable switch includes a non-volatile routing circuit 250. The routing circuit can use flash memory cells to program the switch to couple the electrical connections between the inputs and outputs of the switch. In one embodiment, the routing circuit is pre-programmed based on the implemented scrambling technique. In another embodiment, the routing circuit can be programmed by the user based on a selected address scrambling code.

CONCLUSION

A flash memory has been described that can be coupled to an SDRAM bus that includes address scrambling. The flash memory includes a programmable address de-scrambler. The de-scrambler can be programmed to de-scramble only row addresses, including bank addresses, to maintain a common erase block location for sequential data. The present invention reduces the possibility of writing contiguous data to multiple erase blocks. The de-scrambler can be implemented as a programmable switch. The switch includes a routing circuit that can be programmed in a non-volatile manner.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory comprising:
a plurality of external address connections; and
an address de-scrambler circuit coupled to the plurality of external address connections, wherein the address de-scrambler circuit re-routes signals received on the plurality of address input connections to internal address circuitry.

2. The non-volatile memory of claim 1 wherein the address de-scrambler circuit is programmable.

3. The non-volatile memory of claim 1 wherein the address de-scrambler circuit includes non-volatile memory cells to program the address de-scrambler circuit.

4. The non-volatile memory of claim 1 wherein the plurality of external address connections are coupled to receive row and column addresses, and the address de-scrambler circuit re-routes the column address signals.

5. A flash memory comprising:
an array of non-volatile memory cells arranged in erasable blocks;
address circuitry to access the array;
a plurality of external address connections; and
an address de-scrambler circuit coupled to the plurality of external address connections, wherein the address de-scrambler circuit re-routes signals received on the plurality of external address connections to the address circuitry.

6. The flash memory of claim 5 wherein the address de-scrambler circuit comprises:
a cross point switch having inputs and outputs; and
a program circuit coupled to the cross point switch to electrically couple the inputs and outputs.

7. The flash memory of claim 6 wherein the program circuit comprises non-volatile cells.

8. The flash memory of claim 5 wherein the plurality of external address connections are coupled to receive row and column addresses, and the address de-scrambler circuit re-routes the column address signals.

9. A processing system comprising:
a memory controller to provide scrambled addresses; and
a flash memory coupled to receive the scrambled addresses, the flash memory comprises an address de-scrambler circuit coupled to de-scramble the scrambled addresses.

10. The processing system of claim 9 wherein the address de-scrambler circuit comprises:
a cross point switch having inputs and outputs; and
a program circuit coupled to the cross point switch to electrically couple the inputs and outputs.

11. The processing system of claim 10 wherein the program circuit comprises non-volatile cells.

12. The processing system of claim 9 wherein the scrambled addresses are memory array row addresses.

13. The processing system of claim 9 wherein the memory controller is a synchronous dynamic random access memory (SDRAM) controller.

14. A synchronous flash memory device comprising:
an array of non-volatile memory cells arranged in erasable blocks;
address circuitry to access the array;
data connections, coupled to the array of non-volatile memory cells, to receive data signals;
a plurality of external address connections; and
an address de-scrambler circuit coupled to the plurality of external address connections, wherein the address de-scrambler circuit re-routes signals received on the plurality of external address connections to the address circuitry in the erasable blocks of the array.

15. A method of accessing a flash memory comprising:
   receiving scrambled address signals;
   de-scrambling the address signals; and
   accessing the memory using the de-scrambled addresses.

16. The method of claim 15 wherein the address signals are de-scrambled using an internal de-scrambling circuit.

17. The method of claim 16 wherein the de-scrambling circuit comprises a programmable cross point switch.

18. The method of claim 15 wherein the address signals are row addresses and the scrambled address signals are de-scrambled to correspond to erase blocks of the flash memory.

19. A method of writing to a synchronous memory device comprising:
   receiving scrambled address signals;
   receiving data corresponding to the scrambled address signals;
   de-scrambling the address signals using an internal de-scrambler; and
   storing the data in the memory using the de-scrambled addresses.

20. The method of claim 19 wherein the de-scrambling circuit comprises a programmable cross point switch.

21. The method of claim 19 wherein the synchronous memory device is a non-volatile memory.

22. A method of reading a synchronous memory device comprising:
   receiving scrambled address signals;
   de-scrambling the address signals using an internal de-scrambler; and
   reading data stored in the memory using the de-scrambled addresses.

23. A flash memory comprising:
   an array of non-volatile memory cells arranged in erasable blocks;
   address circuitry to access the array;
   a plurality of external address connections; and
   an address de-scrambler circuit having a cross point switch coupled to the plurality of external address connections, wherein the cross point switch re-route signals received on the plurality of external address connections to the address circuitry in response to non-volatile cells in the cross point switch.

24. A processing system comprising:
   a memory controller to provide scrambled addresses; and
   a flash memory coupled to receive the scrambled addresses, the flash memory comprises an address de-scrambler circuit having a cross point switch to de-scramble the scrambled addresses in response to non-volatile cells in the cross point switch.

* * * * *